United States Patent [19]

Lee

[11] Patent Number: 6,011,503
[45] Date of Patent: Jan. 4, 2000

[54] HALF-FLASH TYPE ANALOG-TO-DIGITAL CONVERTER CAPABLE OF CONVERTING DATA AT HIGH SPEED

[75] Inventor: Dae Young Lee, Kyungki-do, Rep. of Korea

[73] Assignee: Daewoo Telecom Ltd., Incheon, Rep. of Korea

[21] Appl. No.: 08/865,008

[22] Filed: May 29, 1997

[30] Foreign Application Priority Data

May 29, 1996 [KR] Rep. of Korea ...................... 96-18567

[51] Int. Cl.[7] .................................................. H03M 1/36
[52] U.S. Cl. ............................................................. 341/159
[58] Field of Search ................................... 341/156, 164, 341/165

[56] References Cited

U.S. PATENT DOCUMENTS 5,821,893 10/1998 Kumamoto et al. ..................... 341/161

*Primary Examiner*—Brian Young
*Attorney, Agent, or Firm*—Notaro & Michalos P.C.

[57] ABSTRACT

A flash type analog-to-digital converter which generates a digital output signal in response to an analog input signal includes: a first comparator having a reference value being half of a level determining range against the input signal and determining whether the input signal is above or below the reference value; a first encoder for generating the most significant bits of the digital output signal from an output signal of the first comparator; a subtractor for producing a difference between the reference value and the input signal when the input signal is determined to be above the reference value by the first comparator; at least two second comparator for determining an output signal level of the subtractor; and a second encoder for generating the rest of the digital output signal other than the most significant bits from an output of the second comparators.

2 Claims, 4 Drawing Sheets

HALF-FLASH TYPE ANALOG-TO-DIGITAL CONVERTER CAPABLE OF CONVERTING DATA AT HIGH SPEED

FIELD AND BACKGROUND OF THE INVENTION

The present invention relates to a flash type analog-to-digital (A/D) converter and, more particularly, to a flash type A/D converter having a simplified architecture that produces a digital signal using high speed conversion.

DISCUSSION OF RELATED ART

Due to rapid progress in electronics technology, data processing systems are commonly digitalized in the fields of electronics and communications. Typically, A/D converters are widely used to convert analog input signals into binary numbers in most electronics and communications equipment.

The most widely used type of A/D converters are SAR (Successive Approximation Register) converters and flash type A/D converters. SAR type A/D converters are designed employing relatively simple circuitry, but they are comparatively slow in operation. Flash type A/D converters use a complex architecture compared to other types of A/D converters, however, they can produce digital output at higher speed. Thus, flash type A/D converters are preferable for use in systems that require high speed operation.

FIG. 1 is a circuit diagram of a conventional flash type A/D converter which produces an 8-bit binary output signal.

Referring to FIG. 1, the reference symbols CP1 ($CP1_1$ to $CP1_{256}$) represent comparators. A non-inverting terminal (+) of each comparator $CP1_1$ to $CP1_{256}$ is coupled to an analog signal input IN that is supplied from an external source. A plurality of resistors R1 to R256 are connected in series between a reference voltage $V_{REF}$ and ground. Connection nodes between the resistors R1 to R256 are coupled to the inverting terminals (−) of the comparators $CP1_1$ to $CP1_{256}$. Thus, the output voltage of each comparator CP1 is high when the voltage of the analog signal input IN applied to the non-inverting terminal (+) is higher than the reference voltage applied to the corresponding inverting terminal (−).

The reference voltages applied to each of the inverting terminals (−) of the comparators $CP1_1$ to $CP1_{256}$ are determined by the values of the resistors R1 to R256, which are typically identical. Accordingly, the reference voltage increases in equal steps from comparator $CP1_{256}$ to $CP1_1$.

A 256:8 encoder 1 receives a 256-bit signal from the combined outputs of comparators $CP1_1$ to $CP1_{256}$ and converts it to 8-bit data Y0–Y7. A three-state driver 2 produces the 8-bit data Y0–Y7 received from encoder 1 depending on the state of an enable signal EN supplied by controller 3 as described further below.

Controller 3 controllers the analog-to-digital conversion of the input signal IN. When a conversion start signal CS is sent to controller 3 from an external source (not shown), ie., the start signal CS goes to an "active low" state, the controller 3 produces a busy signal BUSY of a low level indicating that an A/D conversion is being performed for the external source equipment. The controller 3 counts the time from the conversion start signal CS to completion of the A/D conversion. The controller 3 then changes the BUSY signal from low to high after a required time to indicate completion of the A/D conversion. When a read-out signal RD is supplied from the external source, the controller 3 sends a low enable signal EN to the three-state driver 2.

In the flash type A/D converter described above, the analog input signal IN is compared by a plurality of comparators $CP1_1$ to $CP1_{256}$ having different references voltages, thereby producing a 256-bit coded data corresponding to the voltage level of the input signal IN. The 256-bit coded data is encoded into an 8-bit digital data by the 256:8 encoder 1.

Since the flash type A/D converter produces a digital output during the encoding operation of the encoder 1, an analog input signal IN is converted into a binary number in a very short time.

However, an undesirably large circuit is required for a flash type A/D converter because the voltage level of the input signal IN is determined by comparators $CP1_1$ to $CP1_{256}$. That is, 256 comparators $CP1_1$ to $CP1_{256}$ and resistors R1 to R256 are needed to produce an 8-bit A/D converter. Accordingly, this type of device involves higher production costs and larger architecture due to the large number of parts.

In order to alleviate these problems with full-flash type A/D converters, half-flash A/D converters have become popular for general use.

FIG. 3 is a circuit diagram of a conventional half-flash type A/D converter which is widely used to produce a 4-bit binary output signal. When referring to FIG. 3, similar parts to those identified in FIG. 1 use the same reference numerals.

In FIG. 3, non-inverting terminals (+) of comparators $CP3_1$ to $CP3_4$ are coupled to an analog signal input IN supplied from an external source (not shown). A plurality of resistors $R3_1$ to $R3_4$ are connected in series between a reference voltage $V_{REF}$ an ground. The nodes between the resistors R31 to R34 are connected to the inverting terminals (−) of the comparators $CP3_1$ to $CP3_4$. When the voltage of the analog input signal IN applied to the non-inverting terminal (+) of each comparator $CP3_1$ to $CP3_4$ is higher than the reference voltage at the corresponding inverting terminal (−) a high signal is output by the comparator.

The reference voltages applied to each of the inverting terminals (−) of comparators $CP3_1$ to $CP3_4$ are determined by the values of resistors $R3_1$ to $R3_4$, which are typically equal. Thus, the reference voltages applied to the inverting terminals (−) are ¾ $V_{REF}$ at comparator $CP3_1$, ½ $V_{REF}$ at comparator $CP3_2$, ¼ $V_{REF}$ at comparator $CP3_3$ and 0 at comparator $CP3_4$.

A first encoder 31 encodes the output of the comparators $CP3_1$ to $CP3_4$ into a 2-bit signal. A digital-to-analog converter 32 converts the 2-bit digital signal of the first encoder 31 into an analog signal. A subtractor 33 generates an output signal which represents the difference between the analog input signal IN and the analog signal from the digital-to-analog converter 32.

Each comparator $CP3_5$ to $CP3_8$ generates a high voltage output when the signal level applied to the non-inverting terminal (+) of the comparator is higher than that applied to the inverting terminal (−). The output signal from subtractor 33 is coupled to the non-inverting terminals (+) of each comparator $CP3_5$ to $CP3_8$. A plurality of resistors $R3_5$ to $R3_8$ having identical values are connected in series between a reference voltage $V_{REF}/4$ and ground. The nodes between the resistors $R3_5$ to $R3_8$ are connected to the inverting terminals (−) of the comparators $CP3_5$ to $CP3_8$. Thus, the reference voltages applied to the inverting terminals of comparators $CP3_5$ to $CP3_8$ are 3/16 $V_{REF}$, ⅛ $V_{REF}$, 1/16 $V_{REF}$ and 0, respectively.

A second encoder 34 encodes the output of the comparators $CP3_5$ to $CP3_8$ into 2-bit data.

When controller 3 sends enable signal EN to three-state driver 2, first the two most significant bits are obtained from the output of first encoder 31, followed by the two least significant bits from second encoder 32. After the 4-bit conversion, three-state driver 2 generates a 4-bit digital signal proportional to the voltage level of the analog input signal IN.

The most significant 2-bit digital signal is generated by comparators $CP3_1$ to $CP3_4$ comparing the analog input signal IN to reference voltages $3/4\ V_{REF}$, $1/2\ V_{REF}$, $1/4\ V_{REF}$ and 0. The most significant 2-bit digital signal is then converted to an analog signal and subtracted from the analog input signal by subtractor 33. The remainder signal is then compared by comparators $CP3_5$ to $CP3_8$ to reference voltages $3/16\ V_{REF}$, $1/8\ V_{REF}$, $1/16\ V_{REF}$ and 0, respectively to generate the least significant 2-bit digital signal.

The advantage of the half-flash type A/D converter is the reduction in hardware as compared with a typical full-flash type A/D converter. For example, only 8 comparators are needed for a 4-bit conversion and 32 comparators for an 8-bit conversion.

Flash type A/D converters are generally used in high speed systems due to the high conversion speed. The conversion speed of circuits such as described in FIG. 1 is usually dependent on the speed of the encoders used.

Half-flash type A/D converters are about half as fast as full-flash A/D converters because the output of the first encoder 31 must be converted into an analog signal, followed by determination of the least significant bits in the second encoder 34. Thus, the half-flash type A/D converter as described above has limitations on its use as well.

SUMMARY OF THE INVENTION

Accordingly, the present invention is directed to a flash type A/D converter that substantially obviates one or more of the problems described above.

An object of the present invention is to provide a flash type A/D converter which is designed to have a simple architecture and produce a digital signal at high speed.

Additional features and advantages of the invention will be set forth in the description which follows, and in part will be apparent from the description, or may be learned by practice of the invention. The objectives and other advantages of the invention will be realized and attained by the structure pointed out in the written description and claims hereof as well as the appended drawings.

To achieve these and other advantages and in accordance with the purpose of the present invention, as embodied and broadly described, a flash type analog-to-digital converter which generates a digital output signal in response to an analog input signal has first comparator circuit using a reference value that is half of a level determining range to determine whether the analog input signal is above or below the reference value. A first encoder generates the most significant bits of the digital output signal from an out put signal of the first comparator circuit. A subtractor generates a difference signal from the reference value and the analog input signal when the analog input signal is determined to be above the reference value by the first comparator circuit. At least two second comparator circuits are used to determine the difference signal level output by the subtractor. A second encoder generates the rest of the digital output signal other than the most significant bits from an output of the second comparator circuit.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DESCRIPTION OF THE PREFERRED EMBODIMENTS

Figure 1:
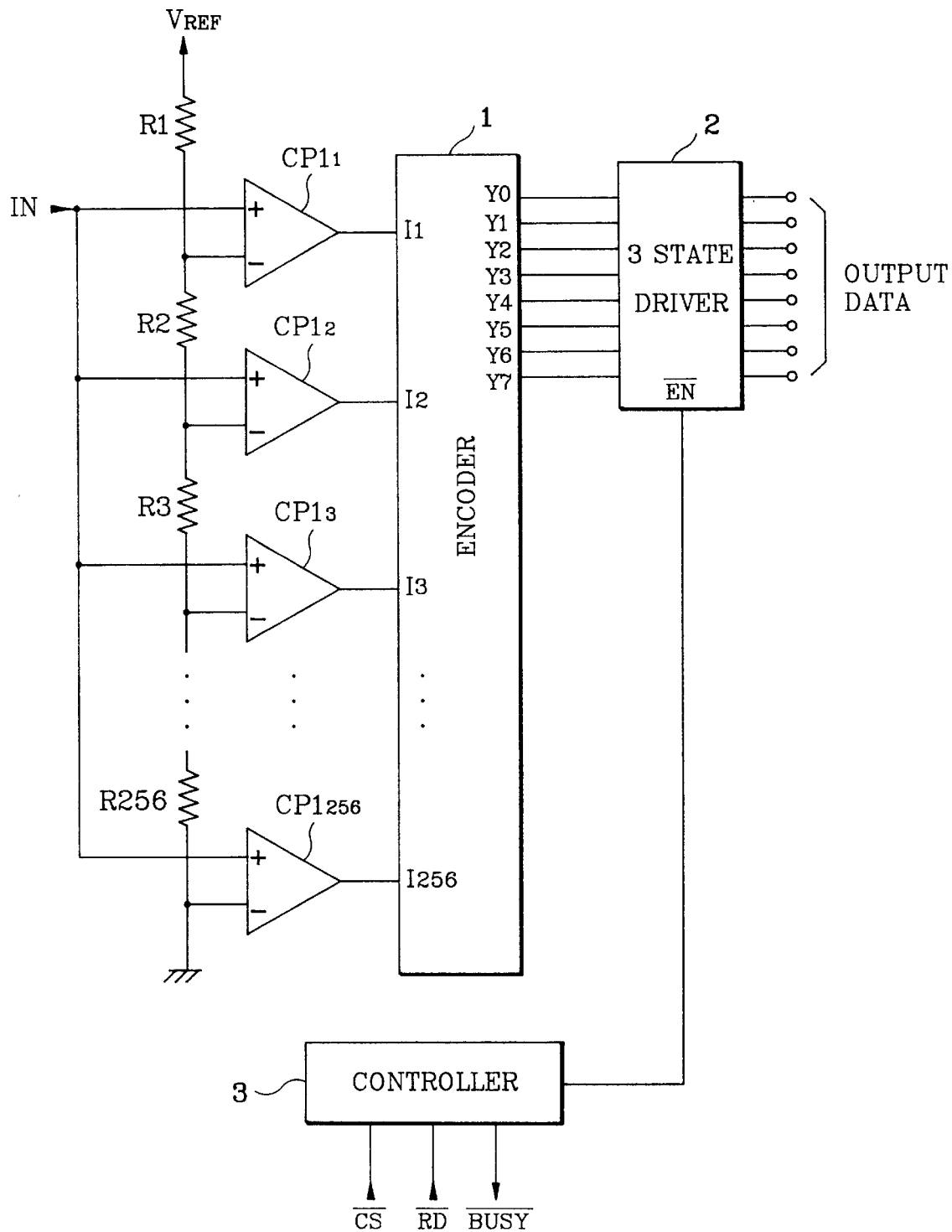
FIG. 1 is a circuit diagram of a prior art flash type A/D converter.
Figure 2:
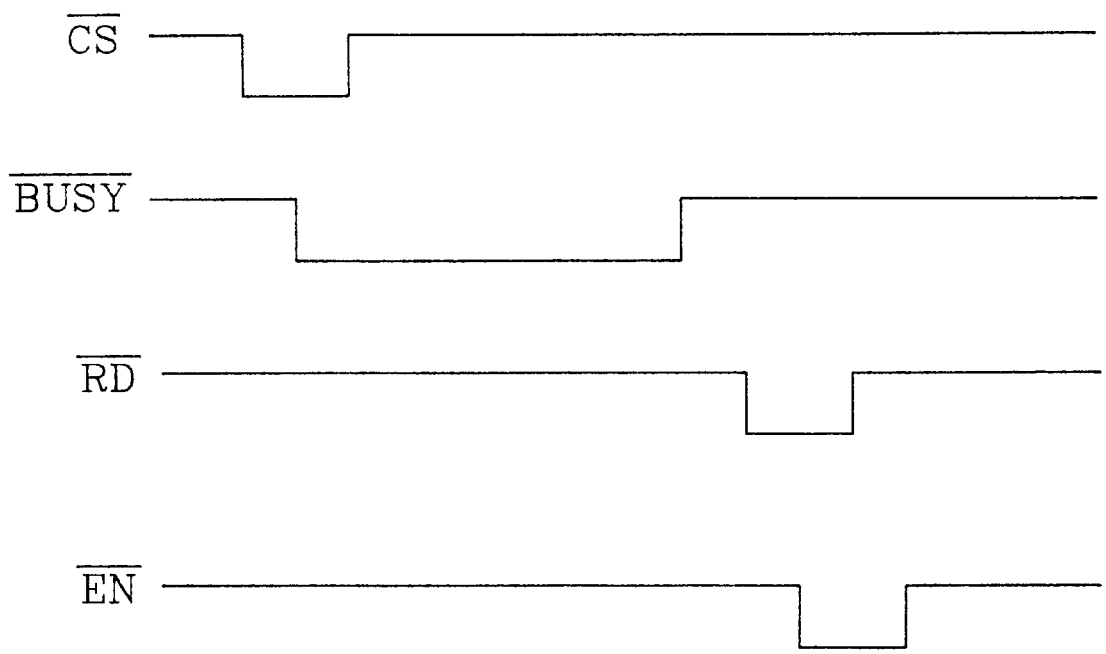
FIG. 2 is a timing diagram for the operation of the prior art A/D converter of FIG. 1.
Figure 3:
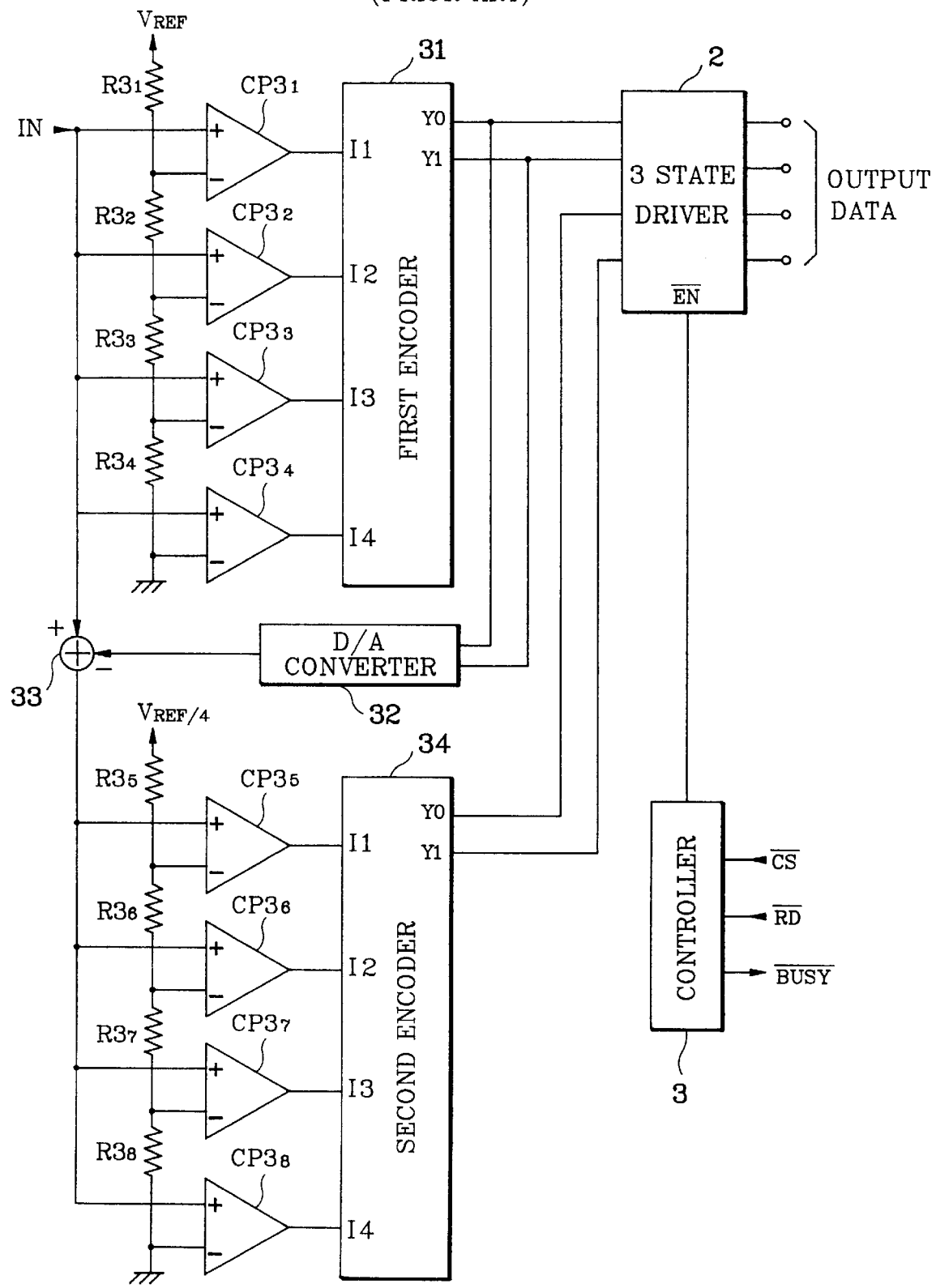
FIG. 3 is a circuit diagram of another prior art flash type A/D converter.

Reference will now be made in detail to the preferred embodiments of the present invention, examples of which are illustrated in the accompanying drawings, and wherein like reference numerals have been used to designate the same or similar elements.

Figure 4:
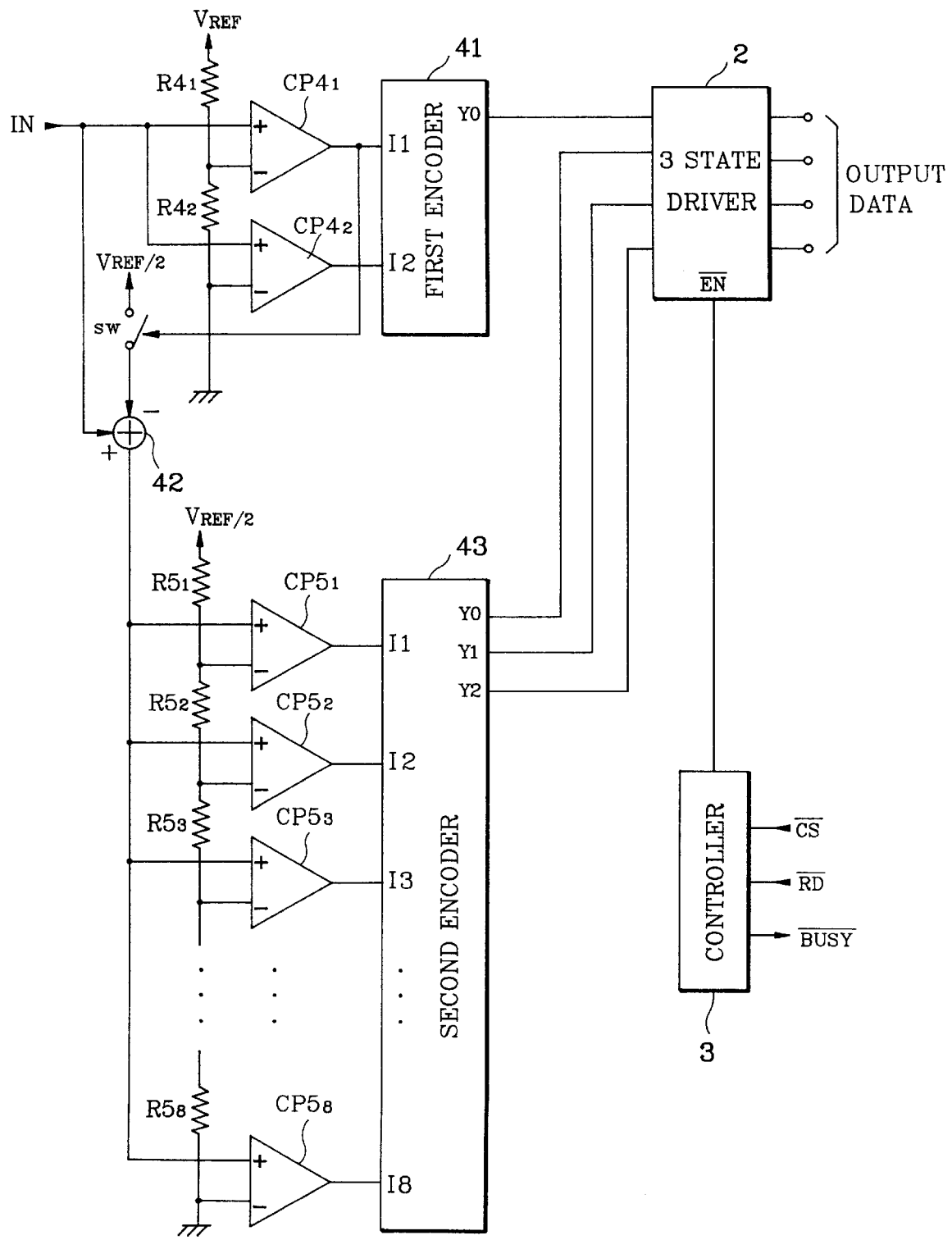
FIG. 4 is a circuit diagram of a flash type A/D converter according to the invention.

FIG. 4 is a circuit diagram of a flash type A/D converter according to the invention. Non-inverting terminals (+) of first and second comparators $CP4_1$, $CP4_2$, respectively, are connected to an analog signal input IN that is supplied from an external source. Resistors $R4_1$ and $R4_2$ are connected in series between reference voltage $V_{REF}$ and ground. The connection node between the resistors $R4_1$ and $R4_2$ is connected to the inverting terminal (−) of first comparator $CP4_1$, while the node between resistor $R4_2$ and ground is connected to the inverting terminal (−) of second comparator $CP4_2$. Each comparator $CP4_1$, $CP4_2$ generates a high output signal when the voltage of the analog input signal IN applied to the non-inverting terminal (+) is greater than the reference voltage applied to the inverting terminal (−). The reference voltages applied to the inverting terminals (−) of the first and second comparators $CP4_1$, $CP4_2$ are determined by the values of the resistors $R4_1$ and $R4_2$, which are preferably equal. Thus, voltages of $1/2\ V_{REF}$ and 0, respectively are applied.

First and second comparators $CP4_1$, $CP4_2$ generate a comparison signal indicating that the analog input signal is above or below one half of the level determining range bounded by $V_{REF}$ and 0.

Switch SW selectively transfers the second reference voltage of $V_{REF}/2$ according to the output level of the first comparator $CP4_1$. When the first comparator $CP4_1$ generates a high comparison signal, the switch SW is turned on and the second reference voltage $V_{REF}/2$ is transmitted. Otherwise, the switch SW is off and the second reference voltage $V_{REF}/2$ is not supplied.

Subtractor 42 generates an output signal corresponding to the difference between the analog input signal IN and the output voltage of the switch SW.

The output signal voltage of the subtractor 42 is connected to the non-inverting terminals (+) of comparators $CP5_1$ to $CP5_8$. A plurality of resistors $R5_1$ to $R5_8$ having identical values are connected in series between a reference voltage $V_{REF}/2$ and ground. The connection nodes between the resistors $R5_1$ to $R5_8$ are connected to the inverting terminals (−) of comparators $CP5_1$ to $CP5_8$. The reference voltages present at each inverting terminal (−) are shown below in Table 1:

TABLE 1

| Comparator | Reference Voltage |
|---|---|
| $CP5_1$ | $7/16\ V_{REF}$ |
| $CP5_2$ | $3/8\ V_{REF}$ |
| $CP5_3$ | $5/16\ V_{REF}$ |
| $CP5_4$ | $1/4\ V_{REF}$ |
| $CP5_5$ | $3/16\ V_{REF}$ |
| $CP5_6$ | $1/8\ V_{REF}$ |
| $CP5_7$ | $1/16\ V_{REF}$ |
| $CP5_8$ | 0 |

First encoder 41 encodes the 2-bit output of comparators $CP4_1$, $CP4_2$ into a 1-bit digital signal and second encoder 42 converts the 8-bit output of comparators $CP5_1$–$CP5_8$ into a 3-bit digital signal.

When an enable signal EN of controller 3 is in an active low state, the one most significant bit (MSB) is obtained from the output of the first encoder 41 and then the three least significant bits (LSB) are obtained from the second encoder 42. After the 4-bit conversion, a three-state driver 2 generates the 4-bit digital signal.

To obtain the most significant 1-bit digital signal, the first and second comparators $CP4_1$, $CP4_2$ determine whether the analog input signal IN is higher or lower than the reference voltage level $V_{REF}/2$ and the result is then encoded by encoder 41.

When the first comparator $CP4_1$ generates a high comparison signal (analog input signal IN is higher than $V_{REF}/2$), switch SW is turned on. Subtractor 42 then subtracts $V_{REF}/2$ from the analog input signal IN.

If first comparator $CP4_1$ generates a low comparison signal, however, switch SW is off and analog input signal IN is applied to comparators $CP5_1$–$CP5_8$ through subtractor 42.

The non-inverting terminals of comparators $CP5_1$–$CP5_8$ always receive an analog signal in the range of 0–$V_{REF}/2$.

Since the comparators $CP5_1$–$CP5_8$ are supplied with reference voltages less than $V_{REF}/2$, they are designed to have a level determining range of $V_{REF}/2$ to determine the analog input signal level.

Second encoder 43 encodes the 8-bit output of the comparators $CP5_1$–$CP5_8$ into a 3-bit signal. The 3-bit output signal is then applied to the three-state driver 2 as the least significant 3-bit input signal.

In this embodiment, whether the analog input signal IN is higher than $V_{REF}/2$ or not is determined to obtain the most significant bits of the output digital signal. The remainder of the signal is generated by the flash type A/D converter.

According to this embodiment, the number of the comparators required from performing an analog-to-digital conversion can be reduced by half compared to a conventional flash type A/D converter because the most significant bits are obtained by a separate architecture.

The first and second encoders 41, 43 process the outputs of the comparators $CP4_1$, $CP4_2$, $CP5_1$–$CP5_8$ nearly at the same time to produce a digital signal as fast as a conventional flash type A/D converter.

AS described above, the flash type A/D converter of the present invention is practical for converting an analog signal into a binary number at high speed with a simplified architecture using a reduced number of comparators.

It will be apparent to those skilled in the art that various modifications and variations can be made in the flash type A/D converter of the present invention without departing from the spirit or scope of the present invention. Thus, it is intended that the present invention cover the modifications and variations of this invention provided they come within the scope of the appended claims and their equivalents.

What is claimed is:

1. A half-flash type analog-to-digital converter for generating a digital output corresponding to the level of an analog input signal, the converter comprising:

first comparing means for generating a signal of first or second level dependent upon whether the analog input signal is greater or less than a reference voltage which is equal to one-half of a level-determining range;

first encoding means for generating the most significant bits of the digital output from an output signal of the first comparing means;

switching means for applying the reference voltage selectively to a subtraction means, the switching means connected between the reference voltage and the subtraction means and turned on and off according to the signal generated by the first comparing means, the subtraction means for subtracting the reference voltage from the analog input signal when the analog input signal is determined to be above the reference voltage by the first comparing means;

at least two second comparing means for generating second comparing outputs corresponding to a subtraction value of a subtraction output signal from the subtraction means; and second encoding means for generating remaining bits of the digital output from the second comparing outputs, the remaining bits being all of the bits of the digital output except for the most significant bits generated by the first encoding means.

2. The half-flash type analog-to-digital converter according to claim 1, wherein the at least two second comparing means generate the second comparing outputs by comparing the subtraction output signal within a second level determining range of zero to one-half of the reference value.

* * * * *